United States Patent [19]

Daimon et al.

[11] Patent Number: 4,983,452

[45] Date of Patent: Jan. 8, 1991

[54] ELECTROCONDUCTIVE THERMOPLASTIC SHEET AND METHOD OF FORMING SAME

[75] Inventors: Takashi Daimon; Hideshi Sakamoto, both of Ichihara, Japan

[73] Assignee: Chisso Corporation, Japan

[21] Appl. No.: 221,365

[22] Filed: Jul. 19, 1988

[30] Foreign Application Priority Data

Jul. 22, 1987 [JP] Japan ................................ 62-182874

[51] Int. Cl.$^5$ ............................................. B32B 27/34
[52] U.S. Cl. ..................................... 428/287; 156/148; 156/178; 156/308.2; 428/284; 428/286; 428/296; 428/300; 428/340; 428/399; 428/408; 428/922
[58] Field of Search ................ 428/284, 286, 287, 296, 428/300, 340, 408, 922, 379; 156/178, 148, 308.2

[56] References Cited

U.S. PATENT DOCUMENTS

| | | | |
|---|---|---|---|
| 4,532,099 | 7/1985 | Kaji | 264/510 |
| 4,891,264 | 1/1990 | Daimon et al. | 428/246 |

*Primary Examiner*—James J. Bell
*Attorney, Agent, or Firm*—Leydig, Voit & Mayer

[57] ABSTRACT

There is here provided an electroconductive thermoplastic sheet prepared by superposing, upon either surface or both the surface of a thermoplastic film, or sheet an electroconductive nonwoven fabric formed by irregularly twining an electroconductive fiber into a hot-melt adhesive fiber, further superposing, upon the outer side of the electroconductive nonwoven fabric, a nonwoven fabric made from the hot-melt adhesive fiber to obtain a laminate, and fusing the laminate integrally.

The sheet of the present invention retains transparency and electroconductivity, and it is suitable for, for example, materials for packing of electronic parts and precision instruments where dust deposition and static electricity obstruction should be avoided.

18 Claims, No Drawings

ELECTROCONDUCTIVE THERMOPLASTIC SHEET AND METHOD OF FORMING SAME

BACKGROUND OF THE INVENTION

1. Field of the Invention

The present invention relates to a thermoplastic sheet having an electroconductive surface.

More particularly, the present invention relates to a nap-free thermoplastic electroconductive sheet of an electroconductive fiber.

2. Description of the Prior Art

Heretofore, as methods for rendering plastics electroconductive, there is a method for blending an antistatic agent with plastics or applying it on the surface of the plastics, and a method for blending carbon black as an electroconductive material with plastics. However, in the former method, an obtained sheet is only improved to a surface resistance of not more than $10^{11}$ Ω or so, and it has the drawback that the surface resistance varies with circumferential humidity.

In the latter method mentioned above, a desired conductivity cannot be obtained if carbon black particles are not blended in such a large amount as to be continuously present in the sheet. However, the use of much carbon black noticeably deteriorates mechanical strength of the basic resin. Furthermore, since the tint of the product is black, colors other than black cannot be obtained. As a technique by which the conventional problems described above are solved, a method has been disclosed in Japanese Patent Publication Laid-Open No. 58-155917 which comprises laminating, by melt extrusion, a basic thermoplastic resin to a nonwoven fabric (electroconductive nonwoven fabric) prepared by irregularly twining an electroconductive fiber into a hot-melt adhesive fiber, and pressing the resulting laminate integrally.

However, in the electroconductive sheet obtained by this method, the electroconductive fiber is present on the surface thereof, and therefore when the sheet is rubbed, the electroconductive fiber is napped and the appearance of the sheet degrades. Moreover, strands of the electroconductive fiber fall off therefrom, and the electroconductive fiber further contaminates surroundings disadvantageously.

SUMMARY OF THE INVENTION

The present invention provides an electroconductive thermoplastic sheet which is excellent in transparency and conductivity and which is free from surface nap.

The present invention is directed to an electroconductive thermoplastic sheet prepared by superposing, upon either surface or both the surfaces of a thermoplastic film or sheet, an electroconductive nonwoven fabric formed by irregularly twining an electroconductive fiber into a hot-melt adhesive fiber, further superposing, upon the outer side of the electroconductive nonwoven fabric, a nonwoven fabric made from the hot-melt adhesive fiber to obtain a laminate, and fusing the laminate integrally.

DETAILED DESCRIPTION OF THE INVENTION

The inventors of the present application have repeatedly researched to obtain an electroconductive sheet having no drawbacks just described, i.e., an electroconductive sheet which is excellent in transparency and conductivity and which is free from surface nap. As a result, it has been found that the intended electroconductive sheet can be obtained by superposing an electroconductive nonwoven fabric on a basic thermoplastic film or sheet integrally, and forming a skin layer of the thermoplastic resin on the surface of the electroconductive nonwoven fabric, and the present invention has been completed on the basis of the knowledge.

An object of the present invention is to provide an electroconductive sheet which is excellent in transparency and electroconductivity and which is free from surface nap.

The present invention is related to an electroconductive thermoplastic sheet prepared by superposing, upon one surface or both the surfaces of a thermoplastic film or sheet, an electroconductive nonwoven fabric formed by irregularly twining and electroconductive fiber into a hot-melt adhesive fiber, further superposing, upon the outer side of the electroconductive nonwoven fabric, a nonwoven fabric made from the hot-melt adhesive fiber to obtain a laminate, and fusing the laminate integrally.

Examples of the thermoplastic resin which is the raw material resin for the electroconductive thermoplastic resin sheet of the present invention include polyolefin resins such as polyethylene, polypropylene, ethylene-vinyl acetate copolymer and ethylene-ethyl acrylate copolymer; styrene resins such as polystyrene, acrylonitrile-butadiene-styrene copolymer and acrylonitrile-styrene copolymer; acrylic resins such as polymethyl acrylate; polyamide resins such as 6-nylon, 6,6-nylon, 12-nylon and 6,12-nylon; polyester resins such as polyethylene terephthalate and polybutylene terephthalate; polyvinyl chloride, polycarbonates, polyphenylene oxide and mixtures thereof.

In the resin mentioned above, there may be blended a heat stabilizer, a weathering stabilizer, a plasticizer, a lubricant, a slip agent, an antistatic agent, a charge transfer type polymer, a nucleating agent, a flame retardant, an inorganic filler, an organic filler, an electroconductive agent, a tackifier (petroleum resin or the like), a pigment, a dye and the like in compliance with its purpose.

Furthermore, examples of the hot-melt adhesive fiber used in the nonwoven fabric made up of the electroconductive nonwoven fabric and the hot-melt adhesive fiber include polyacrylate fiber, polyamide fiber, polyester fiber, polyolefin fiber, polyvinyl chloride fiber and mixed fibers thereof. Any fiber which can hot-melt adhere to the thermoplastic resin of the basic material is acceptable without particular limitation. The hot-melt adhesive fiber, when used, may be blended with a flame retardant, a colorant, an antistatic agent and a charge transfer type polymer, if desired.

In the preferable hot-melt adhesive fiber, its fiber length is from 5 to 100 mm, and its fiber diameter is from 0.5 to 10 denier.

Examples of the electroconductive fibers used in the present invention include metallic compound-coated synthetic fibers prepared by coating synthetic fibers with metallic compounds such as copper sulfide, copper iodide, stannous oxide and indium oxide; metal-plated synthetic fibers prepared by plating synthetic fibers with nickel, copper and the like; carbon-coated synthetic fibers prepared by coating synthetic fibers with electroconductive resins containing carbon particles; metal-plated glass fibers prepared by plating glass fibers with metals such as nickel, copper and the like; carbon fibers; metal-plated carbon fibers prepared by plating carbon fibers with nickel and the like; and metallic fibers prepared by forming aluminum, copper, stainless steel and the like into a fibrous form. Examples of the synthetic fibers for cores of the metallic or carbon composite synthetic fibers include polyacrylonitrile resin, polyamide resin, polyester resin, polyvinyl alcohol resin and polyvinyl chloride resin.

The electroconductive nonwoven fabric and the nonwoven fabric made from the hot-melt adhesive fiber may be prepared by any known method such as a binder process, a thermal fusion process, a wet manufacturing process and a needle punching process. These nonwoven fabrics may be constituted in a double structure in the manufacturing step.

The weight of the electroconductive nonwoven fabric is preferably 30 g/m$^2$ or less, and the weight of the nonwoven fabric made from the hot-melt adhesive fiber is preferably in the range of 5 to 30 g/m$^2$. When the weight of the nonwoven fabric made from the hot-melt adhesive fiber is less than 5 g/m$^2$, the preparation of the nonwoven fabric is impossible, and inversely when it is more than 30 g/m$^2$, the surface resistance of the formed electroconductive sheet is so high that the electroconductivity is lost unpreferably.

The proportion of the electroconductive fiber in a fibrous mixture for the electroconductive nonwoven fabric is in the range of 1 to 99% by weight, preferably 3 to 60% by weight. When the proportion of the electroconductive fiber is in excess of 99% by weight, the preparation of the nonwoven fabric is impossible, and inversely when it is below a level of 1% by weight, any sheets having good electroconductivity cannot be obtained.

The electroconductive thermoplastic resin sheet of the present invention can be prepared by the following procedure:

First, a known method such as an extrusion laminating process, a hot rolling process or a hot pressing process is employed to integrally fuse a the basic material, i.e., the thermoplastic resin layer, the electroconductive nonwoven fabric layer contacting with the thermoplastic resin layer, and the nonwoven fabric made from the hot-melt adhesive fiber in contact with electroconductive nonwoven fabric layer. In this case, a temperature should be selected so that the hot-melt adhesive fiber contained in the electroconductive nonwoven fabric and the hot-melt adhesive fiber in the nonwoven fabric may be perfectly melted and may be integrally laminated to the thermoplastic resin film or sheet which is the base material.

For example, in the case of the extrusion laminating process mentioned above, the thermoplastic resin of the basic material is first melted and kneaded at a resin temperature of 180° to 280° C. in an extruder and is then extruded into the form of a film or sheet through a T-die. The electroconductive nonwoven fabric is superposed upon either surface or both the surfaces of the thus extruded resin film, or sheet, and the nonwoven fabric made from the hot-melt adhesive fiber is then superposed upon the above electroconductive nonwoven fabric. Afterward, the resulting laminate is rolled by a pair of rollers which have been heated to about 30° to 120° C. so as to integrally fuse the basic material, the electroconductive nonwoven fabric and the nonwoven fabric made from the hot-melt adhesive fiber. In this case, for the purpose of facilitating the integral fusion of the basic material, the electroconductive nonwoven fabric and the nonwoven fabric made from the hot-melt adhesive fiber, a heat-resistant film (the thickness of which is preferably from about 10 to 50 μm) such as a biaxially oriented polyester film or a Teflon film is superposed upon the nonwoven fabric made from the hot-melt adhesive fiber, and the superposed films are then pressed and fused. After cooling and curing, the heat-resistant plastic film is peeled off therefrom.

The thickness of the electroconductive thermoplastic sheet can be arbitrarily chosen within the range of 0.03 to 5.0 mm.

With regard to the electroconductive thermoplastic sheets of the present invention, even if the surfaces of the sheets are rubbed, napping of the electroconductive fiber is not observed at all, and the transparency of the sheets is excellent. In addition, the surface resistance of the sheets is also excellent and is in the range of $10^2$ to $10^5$ Ω. Furthermore, in the sheets of the present case, intrinsic characteristics (stiffness, chemical resistance, heat resistance and coloring properties) of the thermoplastic resin used as the basic material are retained intact, and therefore the sheets of the present invention are most desirable as sheets, containers and the like for semiconductors such as IC and LSI. These sheets can be also preferably applied to various uses in which dust deposition and static electrification should be avoided, for example, materials for packing of electronic parts and precision instruments as well as materials for clean rooms.

EXAMPLES

Now, the present invention will be described in detail in reference to examples, but it should not be limited by these examples.

EXAMPLE 1

An electroconductive nonwoven fabric having a weight of 15 g/m$^2$ was prepared using 93% by weight of a sheath core composite fiber (fiber diameter=2 denier, and fiber length=51 mm) comprising a core component of crystalline polypropylene homopolymer (MFR=18 g per 10 minutes) and a sheath component of propylene-ethylene-butene-1 tercopolymer (ethylene content=5.0% by weight, butene-1 content=4.5% by weight, and MFR=12 g per 10 minutes) and 7% by weight of an electroconductive fiber obtained by coating a modacrylic fiber (made by Kanegafuchi Chemical Industry Co., Ltd., trade name Kanekaron SRY, fiber diameter=2 denier, and fiber length=51 mm) with nickel.

A propylene nonwoven fabric having a weight of 8 g/m$^2$ was prepared using a fiber (fiber diameter=1.5 denier, and fiber length=64 mm) obtained from a crystalline polypropylene homopolymer (MFR=25 g per 10 minutes).

Furthermore, a high crystalline polypropylene homopolymer having an isotactic pentad ratio (P) (which was an anisotactic ratio of pentad units in a polypropylene molecular chain measured by the use of $^{13}$C-NMR in accordance with a procedure described in volume VIII, page 687 of Micromolecules) of 0.968, a melt flow rate (MFR) of 0.53 g per 10 minutes, and a high melt flow rate (HMFR) (the discharge amount of a melted resin for 10 minutes in the case that a load of 10.2 kg was applied at a temperature of 230° C.) of 23.5 g per 10 minutes was blended with 0.05% by weight of tetrakis(2,4-di-t-butylphenyl)-4,4-biphenylene diphosphonate, 0.10% by weight of tetrakis[methylene(3,5-di-t-butyl-4-hydroxy hydrocinnamate)]methane and 0.10% by weight of calcium stearate in order to form polypropylene pellets. The thus formed pellets were melted and kneaded by an extruder having a bore diameter of 65 mm and were then extruded into the form of a film at a resin temperature of 260° C. through a T-die having a width of 600 mm.

On either surface of the thus formed resin film, the above-mentioned electroconductive nonwoven fabric was superposed, and on the outer side of this electroconductive nonwoven fabric, the above prepared polypropylene nonwoven fabric was further superposed to form a laminate. This laminate was then fused integrally by three polishing rolls each having a diameter of 250 mm through which warm water of 80° C. was passed, in order to obtain an electroconductive polypropylene sheet having a thickness of 0.7 mm. The surface resistance of the sheet was excellent, i.e., $10^5$ $\Omega$, and in addition, any napping of the electroconductive fiber was not seen. Next, a cloth of Shirting No. 3 was rubbed 2,000 times against the thus obtained sheet under a load of 900 g by the use of a reciprocating rubbing test machine made by Toyoseiki Co., Ltd., but napping was not observed at all on the electroconductive nonwoven fabric laminate sheet.

COMPARATIVE EXAMPLE 1

The same procedure as in Example 1 was repeated with the exception that any polypropylene nonwoven fabric was not used, in order to prepare an electroconductive polypropylene sheet having a thickness of 0.7 mm. The surface resistance of the sheet was $10^5$ $\Omega$ which was a satisfactory value, and any napping of the electroconductive fiber was not seen.

For the surface of the electroconductive nonwoven fabric laminate, a rubbing test was carried out in the same manner as in Example 1, and when reciprocation was carried out about 200 times, the occurrence of napping was confirmed.

EXAMPLE 2

First, an electroconductive nonwoven fabric having a weight of 15 g/m² was prepared using 92% by weight of a sheath core composite fiber (fiber diameter=2 denier, and fiber length=51 mm) comprising the core component of a crystalline polypropylene homopolymer (MFR=18 g per 10 minutes) and the sheath component of propylene-ethylenebutene-1 tercopolymer (ethylene content=5.0% by weight, butene-1 content=4.5% by weight, and MFR=12 g per 10 minutes) and 8% by weight of a stainless steel fiber (fiber diameter=8 μm, fiber length=45 μm, and trade name SUS304) by a thermal fusion process.

A polypropylene nonwoven fabric having a weight of 25 g/m² was prepared using a fiber (fiber diameter=1.5 denier, and fiber length=64 mm) obtained from an ethylene-propylene random copolymer in which the content of ethylene was 3.5% by weight.

Next, the same pellets based on high crystalline polypropylene homopolymer as used in Example 1 were melted and kneaded by an extruder having a bore diameter of 65 mm and were then extruded into the form of a film at a resin temperature of 260° C. through a T-die having a width of 600 mm.

On either surface of the thus formed resin film, the above-mentioned electroconductive nonwoven fabric was superposed, and on the other side of this electroconductive nonwoven fabric, the above prepared polypropylene nonwoven fabric was further superposed to form a laminate. This laminate was then treated in accordance with Example 1 in order to obtain an electroconductive polypropylene sheet having a thickness of 0.7 mm. The surface resistance of the sheet was excellent, i.e., $10^4$ $\Omega$, and in addition, any napping of the electroconductive fiber was not seen. Next, a cloth of Shirting No. 3 was rubbed 2,000 times against the thus obtained sheet under a load of 900 g by the use of a reciprocating rubbing test machine made by Toyoseiki Co., Ltd., but napping was not observed at all on the electroconductive nonwoven fabric laminate sheet.

COMPARATIVE EXAMPLE 2

The same procedure as in Example 2 was repeated with the exception that any polypropylene nonwoven fabric was not used, in order to prepare an electroconductive polypropylene sheet having a thickness of 0.7 mm. The surface resistance of the sheet was $10^4\Omega$ which was a satisfactory value, and any napping of the electroconductive fiber was not seen.

For the surface of the electroconductive nonwoven fabric laminate, a rubbing test was carried out in the same manner as in Example 1, and when reciprocation was carried out about 200 times, the occurrence of napping was confirmed.

COMPARATIVE EXAMPLE 3

The same procedure as in Example 1 was repeated with the exception that the weight of polypropylene nonwoven fabric was 40 g/m², in order to prepare an electroconductive polypropylene sheet having a thickness of 0.7 mm. In the thus prepared sheet, any napping of the electroconductive fiber was not seen. For the surface of the electroconductive nonwoven fabric laminate, a rubbing test was carried out in the same manner as in Example 1, and even when reciprocation was carried out about 2,000 times, any napping was not confirmed. However, the surface resistance of the sheet was $10^{10}\Omega$, which value was very poor.

EXAMPLE 3

An electroconductive nonwoven fabric having a weight of 10 g/m² was prepared from 80% by weight of a polyvinyl chloride fiber (trademark Teviron; made by Teijin Limited) having a fiber diameter of 3 denier and a fiber length of 51 mm and 20% by weight of an austenite stainless steel fiber (trademark NASLON; made by Nippon Seisen Co., Ltd.) having a fiber diameter of 8 μm and a fiber length of 40 mm.

A polyvinyl chloride nonwoven fabric having a weight of 10 g/m² was prepared from a polyvinyl chloride fiber (trademark Teviron; made by Teijin Limited) having a fiber diameter of 2 denier and a fiber length of 51 mm.

Next, polyvinyl chloride having an average polymerization degree of 1,300 was mixed with 3.0 parts by weight of dioctyl phthalate, 2.5 parts by weight of dibutyltin alkylmaleate, 0.5 part by weight of butyl stearate, 0.4 part by weight of stearyl alcohol and 0.1 part by weight of stearic acid in order to form a polyvinyl chloride compound, and this compound was then melted and kneaded by an extruder having a bore diameter of 65 mm and was extruded into the form of a film at a resin temperature of 185° C. through a T-die having a width of 500 mm.

On both the surfaces of the thus formed resin film, the above prepared electroconductive nonwoven fabric films were superposed, and on the outer sides of the electroconductive nonwoven fabric films, the above prepared nonwoven fabric films made from the polyvinyl chloride fiber alone were further superposed. Afterward, these superposed films were rolled and fused integrally by a touch roll (metallic roll) having a diameter of 200 mm through which warm water at 80° C. was passed and a chilled roll (metallic) having a diameter of 400 mm, thereby obtaining an electroconductive polyvinyl chloride sheet having a thickness of 0.5 mm.

In this process, a biaxially oriented polyester film of 12 μm in thickness was superposed upon the outer side of the nonwoven fabric made from the polyvinyl chloride fiber alone on the side of the touch roll, and the thus laminated films were rolled and fused. After cooling and curing of the electroconductive polyvinyl chloride sheet, the polyester film was peeled off therefrom.

Both the surfaces of the thus obtained sheet had an excellent surface resistance of $10^3$ to $10^4 \Omega$, any napping of the stainless steel fiber was not seen. Next, a cloth of Shirting No. 3 was rubbed 2,000 times against the sheet under a load of 900 g by the use of a reciprocating rubbing test machine made by Toyoseiki Co., Ltd., but napping was not observed at all on both the surfaces of the stainless steel fiber.

What is claimed is:

1. An electroconductive thermoplastic integrally laminated sheet comprising:
   (a) a thermoplastic sheet;
   (b) an electroconductive nonwoven fabric formed from electroconductive fibers irregularly intertwined with hot-melt adhesive fibers, said electroconductive nonwoven fabric being superposed on at least one surface of said thermoplastic sheet; and
   (c) a nonwoven fabric formed from said hot-melt adhesive fibers superposed upon the outer surface of said electroconductive nonwoven fabric.

2. An electroconductive thermoplastic sheet according to claim 1 wherein the weight of the nonwoven fabric formed from the hot-melt adhesive fiber is in the range of 5 to 30 $g/m^2$.

3. An electroconductive thermoplastic sheet according to claim 1 wherein the thermoplastic resin for the thermoplastic film or sheet is at least resin one two or more selected from the group consisting of polyethylene, polypropylene, ethylene-vinyl acetate copolymer, ethylene-ethyl acrylate copolymer, polystyrene, acrylonitrile-butadiene-styrene copolymer, acrylonitrile-styrene copolymer, polymethyl acrylate, 6-nylon, 6,6-nylon, 12-nylon and 6,12-nylon, polyethylene terephthalate, polybutylene terephthalate, polyvinyl chloride, polycarbonates and polyphenylene oxide.

4. An electroconductive thermoplastic sheet according to claim 1 wherein the hot-melt adhesive fiber used in the electroconductive nonwoven fabric and the nonwoven fabric made from the hot-melt adhesive fiber is prepared by subjecting, to post-treatments of melting, spinning, stretching, crimping and cutting, at least one material selected from the group consisting of propylene homopolymer, propylene-ethylene block copolymer, propylene-ethylene random copolymer, propylene-ethylene-butene-1 block copolymer, propylene-ethylene-butene-1 random copolymer and propylene-butene-1 random copolymer containing at least 70% by weight of a propylene component, modified polypropylenes prepared by modifying the above-mentioned copolymers with an unsaturated carboxylic acid or its anhydride, polyethylene, polyacrylonitrile, polyamide, polyvinyl chloride, polyethylene terephthalate or polybutylene terephthalate.

5. An electroconductive thermoplastic sheet according to claim 1 wherein the electroconductive fiber is at least one selected from the group consisting of metallic compound-coated synthetic fibers prepared by coating synthetic fibers with metallic compounds such as copper sulfide, copper iodide, stannous oxide and indium oxide; metal-plated synthetic fibers prepared by plating synthetic fibers with nickel, copper and the like; carbon-coated synthetic fibers prepared by coating synthetic fibers with electroconductive resins containing carbon particles; metal-plated glass fibers prepared by plating glass fibers with metals such as nickel, copper and the like; carbon fibers; metal-plated carbon fibers prepared by plating carbon fibers with nickel and the like; and metallic fibers prepared by converting aluminum, copper, stainless steel and the like into a fibrous form.

6. An electroconductive thermoplastic sheet according to claim 1 wherein the electroconductive nonwoven fabric and the nonwoven fabric formed from hot-melt adhesive fiber are prepared by a method of a binder process, a thermal fusion process, a wet manufacturing process or a needle punching process.

7. An electroconductive thermoplastic sheet according to claim 1 wherein the weight of the electroconductive nonwoven fabric is 30 $g/m^2$ or less.

8. An electroconductive thermoplastic sheet according to claim 1 wherein the concentration of the electroconductive fiber in a fibrous mixture for the electroconductive nonwoven fabric is in the range of 1 to 99% by weight.

9. An electroconductive thermoplastic sheet according to claim 1 wherein the concentration of the electroconductive fiber in a fibrous mixture for the electroconductive nonwoven fabric is in the range of 3 to 60% by weight.

10. A process for forming an electroconductive thermoplastic sheet comprising:
    irregularly intertwining electroconductive fibers with hot-melt adhesive fibers to form an electroconductive nonwoven fabric;
    superposing said electroconductive nonwoven fabric upon at least one surface of a thermoplastic sheet;
    superposing a nonwoven fabric formed from said hot-melt adhesive fibers on the outer surface of said electroconductive nonwoven fabric to form a laminate; and
    fusing said laminate.

11. The process for forming an electroconductive thermoplastic sheet according to claim 10 wherein the weight of the nonwoven fabric formed from the hot-melt adhesive fiber is in the range of 5 to 30 $g/m^2$.

12. The process for forming an electroconductive thermoplastic sheet according to claim 10 wherein the thermoplastic resin for the thermoplastic film or sheet is at least one resin selected from the group consisting of polyethylene, polypropylene, ethylene-vinyl acetate copolymer, ethylene-ethyl acrylate copolymer, polystyrene, acrylonitrile-butadiene-styrene copolymer, acrylonitrile-styrene copolymer, polymethyl acrylate, 6-nylon, 6,6-nylon, 12-nylon and 6,12-nylon, polyethylene terephthalate, polybutylene terephthalate, polyvinyl chloride, polycarbonates and polyphenylene oxide.

13. The process for forming an electroconductive thermoplastic sheet according to claim 10 wherein the hot-melt adhesive fiber used in the electroconductive nonwoven fabric and the nonwoven fabric made from the hot-melt adhesive fiber is prepared by subjecting, to post-treatments of melting, spinning, stretching, crimping and cutting, at least one material selected from the group consisting of propylene homopolymer, propylene-ethylene block copolymer, propylene-ethylene random copolymer, propylene-ethylene-butene-1 block copolymer, propylene-ethylene-butene-1 random copolymer and propylene-butene-1 random copolymer containing at least 70% by weight of a propylene component, modified polypropylenes prepared by modifying the above-mentioned copolymers with an unsaturated carboxylic acid or its anhydride, polyethylene, polyacrylonitrile, polyamide, polyvinyl chloride, polyethylene terephthalate or polybutylene terephthalate.

14. The process for forming an electroconductive thermoplastic sheet according to claim 10 wherein the electroconductive fiber is at least one selected from the group consisting of metallic compound-coated synthetic fibers prepared by coating synthetic fibers with metallic compounds such as copper sulfide, copper iodide, stannous oxide and indium oxide; metal-plated synthetic fibers prepared by plating synthetic fibers with nickel, copper and the like; carbon-coated synthetic fibers prepared by coating synthetic fibers with electroconductive resins containing carbon particles; metal-plated glass fibers prepared by plating glass fibers with metals such as nickel, copper and the like; carbon fibers; metal-plated carbon fibers prepared by plating carbon fibers with nickel and the like; and metallic fibers prepared by converting aluminum, copper, stainless steel and the like into a fibrous form.

15. The process for forming an electroconductive thermoplastic sheet according to claim 10 wherein the electroconductive nonwoven fabric and the nonwoven fabric formed from hot-melt adhesive fiber are prepared by a method of a binder process, a thermal fusion process, a wet manufacturing process or a needle punching process.

16. The process for forming an electroconductive thermoplastic sheet according to claim 10 wherein the weight of the electronconductive nonwoven fabric is 30 g/m$^2$ or less.

17. The process for forming an electroconductive thermoplastic sheet according to claim 10 wherein the concentration of the electroconductive fiber in a fibrous mixture for the electroconductive nonwoven fabric is in the range of 1 to 99% by weight.

18. The process for forming an electroconductive thermoplastic sheet according to claim 10 wherein the concentration of the electroconductive fiber in a fibrous mixture for the electroconductive nonwoven fabric is in the range of 3 to 60% by weight.

* * * * *

UNITED STATES PATENT AND TRADEMARK OFFICE
CERTIFICATE OF CORRECTION

PATENT NO. : 4,983,452
DATED : January 8, 1991
INVENTOR(S) : Daimon, et. al.

It is certified that error appears in the above-indentified patent and that said Letters Patent is hereby corrected as shown below:

Column 7, lines 44 and 45, change "least resin one two or more" to

--least one resin--.

Signed and Sealed this

Sixth Day of July, 1993

Attest:

MICHAEL K. KIRK

*Attesting Officer*   *Acting Commissioner of Patents and Trademarks*